United States Patent [19]

Kamigaito et al.

[11] Patent Number: 4,673,587
[45] Date of Patent: Jun. 16, 1987

[54] METHOD OF PRODUCING A COMPOSITE CERAMIC BODY

[75] Inventors: Osami Kamigaito; Shoji Noda; Haruo Doi, all of Aichi, Japan

[73] Assignee: Kabushiki Kaisha Toyota Chuo Kenkyusho, Aichi, Japan

[21] Appl. No.: 844,972

[22] Filed: Mar. 27, 1986

[30] Foreign Application Priority Data

Apr. 26, 1985 [JP] Japan .................................. 60-91534

[51] Int. Cl.$^4$ ......................... B05D 3/06; C23C 14/00
[52] U.S. Cl. .................................. 427/38; 204/192.35; 204/192.37
[58] Field of Search ....................... 427/38; 204/192 C

[56] References Cited

U.S. PATENT DOCUMENTS 4,249,962 2/1981 Celler ............................. 427/53.1 X
4,364,778 12/1982 Leamy et al. .................. 427/53.1 X Primary Examiner—Bernard D. Pianalto
Attorney, Agent, or Firm—Oblon, Fisher, Spivak, McClelland & Maier

[57] ABSTRACT

A method of producing a composite ceramic body which is comprises forming an amorphous ceramic film on the surface of a ceramic substrate; and irradiating said film with ions of high energy to cause atom mixing between said ceramic substrate and said amorphous ceramic film and to allow said film to adhere firmly and integrally to said substrate.

3 Claims, No Drawings

METHOD OF PRODUCING A COMPOSITE CERAMIC BODY

BACKGROUND OF THE INVENTION

1. Field of the Invention

This invention relates to a method of producing a composite ceramic body. More particularly, it relates to a method of producing a ceramic material having a surface covered with an amorphous ceramic film which gives it a high degree of strength, especially when it is brought into point contact or Hertz's contact pressure with another object.

2. Description of the Prior Art

Ceramics, such as silicon nitride ($Si_3N_4$) and silicon carbide (SiC), are expected to be very useful as materials for constructing various kinds of structures. They are very hard and excellent in heat resistance. They, however, also have the drawback of being brittle. It is necessary to eliminate this drawback in order to render them useful for a wider scope of application. The attempts hitherto made in this connection have mainly been to improve the materials per se. They have, for example, included the partial stabilization of zirconia ($ZrO_2$) and the addition of $ZrO_2$ to alumina ($Al_2O_3$). All of these attempts have been intended for preventing the fracture of the material by the stress-induced phase transformation of $ZrO_2$. None of these methods is, however, applicable to all kinds of ceramics.

An another attempt has recently come to be made to improve the drawback of a ceramic material by irradiating ions on its surface. For example, it is known that the irradiation of ions on the surface of $Al_2O_3$ for making it amorphous makes it easily deformable and thereby restricts its fracture. This method is, however, effective only under limited conditions. For example, the formation of an amorphous surface on $Al_2O_3$ requires cooling by liquid nitrogen during ion irradiation, though it permits the use of nitrogen ions which are relatively easily available.

And this method is not applicable to all kinds of ceramics, an amorphous layer cannot be formed on some ceramics.

SUMMARY OF THE INVENTION

It is an object of this invention to provide a method which can produce a composite ceramic body having a high degree of strength, especially against any impact resulting from its point contact with another object.

This object is attained by a method which comprises forming an amorphous ceramic film on the surface of a ceramic substrate and irradiating the amorphous ceramic film with ions of high energy to cause atom mixing between the ceramic substrate and the amorphous ceramic film and to allow the amorphous ceramic film to adhere firmly and integrally to the ceramic substrate.

According to this method, formation of an amorphous layer is easier than according to the conventional method. And this method is applicable almost all kinds of ceramics.

The composite ceramic body of this invention has, among others, the advantage of absorbing any impact load or energy effectively without having any crack on its surface at any point of contact where the load or Hertz's contact pressure has been applied.

DETAILED DESCRIPTION OF THE INVENTION

According to the method of this invention, an amorphous ceramic film is formed on the surface of a ceramic substrate. The ceramic substrate may be composed of any ceramic material of the type which is not an oxide, such as silicon nitride ($Si_3N_4$) or silicon carbide (SiC), or any oxide ceramics, such as aluminum oxide ($Al_2O_3$) or zirconium oxide ($ZrO_2$). All of these ceramics are well known in the art. It may have any desired shape.

The amorphous ceramic film is formed from any ceramic material that can be rendered amorphous and maintain a relatively stable amorphous phase. Some examples of such material are $Si_3N_4$, $Al_2O_3$, $SiO_2$ and mullite. The film can be formed by any known method, such as sputtering or chemical vapor deposition. The film as formed does, however, not form a strong bond with the ceramic substrate, so is likely to peel off easily if it is brought into point contact with another object.

While various kinds of materials have been mentioned for each of the ceramic substrate and the amorphous ceramic film, it is desirable to use the same material in order to avoid the development of any thermal stress that would result from the use of different materials having different coefficients of thermal expansion. This invention does, however, not preclude the use of any combination of different materials.

The film preferably has a thickness of, say, 0.1 to 10 microns. If its thickness is less than 0.1 micron, the advantages which can be expected from this invention will be reduced. A film having a thickness exceeding 10 microns is likely to peel off the substrate. This is particularly the case if there exists any thermal stress due to the use of different materials having different coefficients of thermal expansion. A film having a thickness which is larger than, say, 10 microns also has the disadvantage of requiring ions of higher energy during the subsequent step of ion irradiation.

The surface of the ceramic substrate can be cleaned by, for example, back sputtering before the amorphous ceramic film is formed thereon. This improves the adhesion of the film to the substrate, so that it may not peel off easily.

According to this invention, ions of high energy in the form of particles are, then, irradiated on the amorphous ceramic film. The irradiation of ions forms an integral bond of the film with the substrate. The particles which can be irradiated may be of any element that remains gaseous at an ordinary room temperature, such as helium (He), nitrogen (N), neon (Ne), argon (Ar) or xenon (Xe), or of a metal element, such as silicon (Si) or aluminum (Al). The ions obtained by the ionization of any such element are accelerated by an electrical field and the resulting ions of high energy are irradiated on the film. The energy or the degree of acceleration depends on the thickness of the film. It is preferably so determined that the irradiated ions may have an average depth of penetration which is equal to, or slightly (about 1.1 times) greater than, the thickness of the film. The energy for accelerating the ions must be increased with an increase in the thickness of the film. In order to increase the accelerating energy, it is usually necessary to employ an accelerator which can produce energy in the order of at least 3 MeV. The use of such an accelerator is, however, not practical. According to this invention, it is sufficient to employ an apparatus which can produce accelerating energy in the order of, say, 400 to 500 KeV. About 60 KeV of energy is required for accelerating the ions to be irradiated on a film having a thickness of 0.1 micron, and about 3 MeV of energy on a film having a thickness of 10 microns.

A momentum transfer from a projected ion to a target atom occurs most efficiently when the ions nearly stop. Therefore, atom mixing may occur most efficiently at the interface between the thin film and the substrate and then the film may form an integral part with ceramic material when the average depth of ion penetration is nearly equal to or slightly larger than the film thickness.

The amount of the ions to be irradiated depends on the substance of which they are composed, but is usually in the range of $1 \times 10^-$ to $1 \times 10^{18}$ ions per square centimeter of the film surface. It can be decreased with an increase in the mass of the ions which are irradiated. The irradiation of less than $1 \times 10^{14}$ ions per square centimeter may fail to form a satisfactorily strong bond of the film with the substrate. The irradiation of more than $1 \times 10^{18}$ ions per square centimeter is not recommendable, as it does not produce any correspondingly better result. The irradiation of $1 \times 10^{14}$ to $1 \times 10^{18}$ ions per square centimeter forms an appropriate mixture of the film and the substrate at the interface and thereby producing a composite ceramic body in which the amorphous ceramic film forms an integral part of the ceramic substrate, and which has, therefore, an improved degree of resistance against any load applied thereto at any point of contact or Hertz's contact.

The improved strength of the composite body according to this invention can be ascertained as will hereinafter be described. The load is applied to the material by, for example, the test indenter of a Vickers hardness tester. If the indenter is pressed against the surface to be tested, it forms a square mark or impression thereon. The ceramic substrate on which no amorphous ceramic film was formed cracks at the corners of the mark. No such crack is, however, found on the composite material according to this invention. Moreover, the mark formed on the composite material of this invention is larger than that on the ceramic substrate. These facts confirm that the presence of the amorphous ceramic film forming an integral part of the ceramic substrate makes the latter easily deformable.

In order to improve the heat resistance or high temperature characteristics of a sintered ceramic product, it is necessary to reduce its glass phase as far as possible. If the glass phase is reduced, however, the ceramic material becomes brittle and difficult to deform. If it is not easily deformable, it cannot withstand any impact or point contact load. The method of this invention, however, enables the production of a ceramic product which is highly resistant to any impact or point contact load, while retaining excellent high temperature characteristics. The method of this invention is also applicable to any conventionally known ceramic substrate having a relatively high glass content. The method of this invention is useful for improving the impactor point contact load or Hertz's contact pressure resistance of almost all kinds of ceramic products.

The invention will now be described more specifically with reference to several examples thereof.

EXAMPLE 1

A compacted product of $Si_3N_4$ powder containing a sintering aid was sintered at an atmospheric pressure. A plurality of specimens having a width of 4 mm, a thickness of 3 mm and a length of 20 mm was cut from the sintered product. Each specimen was ground to a surface roughness not exceeding 0.2 s, i.e. a maximum peak-to-valley height of 0.2 μm. An amorphous ceramic film of $Si_3N_4$ having a thickness of 0.3 micron was formed by RF-sputtering of a $Si_3N_4$ target in a Ar pressure of about $10^{-3}$ torr on the surface of each substrate. The silicon nitride used to form the film contains virtually no impurities. The substrate on which the film had been formed was subjected to an ion implantation. N ions from a Cockcroft-Walton accelerator were irradiated on the film to yield a composite ceramic body. The energy of the ions was set to be 140 keV. Six samples were prepared by the irradiation of energy. Six samples were prepared by the irradiation of six different amounts of ions ranging from $5 \times 10^{15}$ to $5 \times 10^{17}$ ions per square centimeter, as shown at Runs Nos. 1 to 6 in TABLE 1 below.

The Vickers hardness Hv of each sample was measured at a load of 200 g and features of the mark were examined. The results are shown in TABLE 1.

For the sake of comparison, the same tests were conducted on the ceramic substrate as prepared (Run No. C1).

TABLE 1

| Run No. | 1 | 2 | 3 | 4 | 5 | 6 | C1 |
|---|---|---|---|---|---|---|---|
| Irradiation (ions/cm$^2$) | $5 \times 10^{15}$ | $1 \times 10^{16}$ | $5 \times 10^{16}$ | $1 \times 10^{17}$ | $2 \times 10^{17}$ | $5 \times 10^{17}$ | — |
| Hv (200 g) | 1300 | 1285 | 1262 | 1250 | 1190 | 1120 | 1515 |
| Mark | Clear and having no crack | Clear and having no crack | Clear and having no crack | Clear and having no crack | Clear and having no crack | Clear and having no crack | Having cracks |

As is obvious from TABLE 1, the composite products of this invention showed a hardness which was greatly lower than that of the ceramic substrate itself, and which became lower with an increase in the amount of ions irradiated. The reduction in hardness was particularly remarkable on the samples on which $2 \times 10^{17}$ or more ions had been irradiated per square centimeter. It was also found that the irradiation of more than $1 \times 10^{18}$ ions per square centimeter would form blisters on the irradiated surface.

EXAMPLE 2

The procedure of EXAMPLE 1 was repeated for preparing a number of ceramic substrates. A layer having a thickness of about 0.02 micron was removed from the surface of each substrate by sputter etching in a RF-sputtering apparatus. The procedure of EXAMPLE 1, that is, fhe formation of an amorphous ceramic film of $Si_3N_4$ on each substrate by a RF-sputtering and ion-irradiation to the film was repeated again to produce a composite ceramic body.

Each composite ceramic body, thus prepared, was examined for Vickers hardness Hv at a load of 200 g. The results are shown in TABLE 2, in which C2 is a comparative sample having a film of $Si_3N_4$ on which no ion was irradiated.

TABLE 2

| Run No. | 7 | 8 | 9 | 10 | 11 | C2 |
|---|---|---|---|---|---|---|
| Irradiation (ions/cm$^2$) | $5 \times 10^{15}$ | $1 \times 10^{16}$ | $5 \times 10^{16}$ | $1 \times 10^{17}$ | $5 \times 10^{17}$ | — |
| Hv (200 g) | 1287 | 1260 | 1200 | 1180 | 1080 | 1302 |
| Mark | The marks formed on all of the samples were clear and free from any crack. | | | | | |

The samples showed a reduction in hardness with an increase in the amount of the ions irradiated thereon. Sample No. 11. on which $5 \times 10^{17}$ ions had been irradiated per square centimeter, was about 30% lower in hardness than Sample No. C2 on which no ion had been irradiated. This reduction in hardness serves to absorb any tensile stress in the area close to the mark.

EXAMPLE 3

The procedure of EXAMPLE 1 was repeated for preparing a ceramic substrate. An amorphous Si$_3$N$_4$ film having a thickness of 0.3 micron was formed on the surface of the substrate by chemical vapor deposition. The film was formed by employing SiCl$_4$ and NH$_3$. The SiCl$_4$ was supplied in a carrier gas of H$_2$, and NH$_3$ gas directly, so that the two gases might be mixed on the substrate. They were reacted at a temperature of 1200° C. The film was, then, irradiated with $1 \times 10^{17}$ nitrogen ions per square centimeter which had been accelerated by 140 keV of energy. The irradiated surface showed a Vickers hardness Hv of 1250 at a load of 200 g. It was about 17% lower than the hardness of the ceramic substrate.

EXAMPLE 4

Substrates of different ceramic materials each having a width of 4 mm, a thickness of 3 mm and a length of 20 mm were prepared as shown at Runs Nos. 12 to 17 in TABLE 3 below. An amorphous ceramic film was formed on the surfce of each substrate by sputtering the ceramic material shown in TABLE 3 in an Ar pressure of less than $10^{-3}$ Torr. The resulting products were irradiated with different amounts of ions accelerated by different amounts of energy. The irradiated surface of each sample was examined for Vickers hardness Hv at a load of 500 g. The results are shown in TABLE 3.

Each sample confirmed that the irradiation of ions would enable the amorphous ceramic film to combine intimately with the substrate and produce a composite ceramic body of reduced hardness. It is, thus, obvious that the amorphous ceramic film forming an integral part of the substrate surface improves its resistance to any load of point contact.

TABLE 3

| Run No. | 12 | 13 | 14 | 15 | 16 | 17 |
|---|---|---|---|---|---|---|
| Ceramic substrate | Si$_3$N$_4$ | Sialon | SiC | Al$_2$O$_3$ (sintered) | Sapphire | ZrO$_2$ |
| Amorphous ceramic film | SiO$_2$ | Al$_2$O$_3$ | Si$_3$N$_4$ | Al$_2$O$_3$ | Al$_2$O$_3$ | Al$_2$O$_3$ |
| Film thickness (micron) | 0.3 | 0.3 | 0.2 | 0.4 | 0.22 | 0.3 |
| Ions irradiated | N | N | Ar | N | Xe | N |
| Accelerating energy (KeV) | 120 | 200 | 240 | 280 | 1000 | 200 |
| Ions/cm$^2$ | $1 \times 10^{17}$ | $2 \times 10^{17}$ | $5 \times 10^{16}$ | $2 \times 10^{17}$ | $5 \times 10^{15}$ | $1 \times 10^{17}$ |
| Hv of substrate at 500 g | 1650 | 1550 | 2600 | 1800 | 2300 | 1300 |
| Hv of composite product at 500 g | 1100 | 1120 | 1800 | 1260 | 1610 | 1000 |

What is claimed is:

1. A method of producing a composite ceramic body, comprising:
   forming an amorphous ceramic film selected from the group consisting of silicon nitride (Si$_3$N$_4$), aluminum oxide (Al$_2$O$_3$), silicon oxide (SiO$_2$) and mullite on the surface of a ceramic substrate selected from the group consisting of silicon nitride (Si$_3$N$_4$), silicon carbide (SiC), aluminum oxide (Al$_2$O$_3$) and zirconium oxide (ZrO$_2$), said film having a thickness of 0.1 to 10 microns; and
   irradiating said film with ions selected from the group consisting of helium, nitrogen, neon, argon and xenon, said ions having high energy ranging from 60 KeV to 3 MeV which causes atom mixing between said substrate and said film thereby resulting in firm and integral adherence of said film to said ceramic substrate.

2. The method of claim 1, wherein said film is formed by the sputtering or chemical vapor deposition of ceramic material on said substrate.

3. The method of claim 1, wherein the dosage of said ions is in the range of $1 \times 10^{14}$ to $1 \times 10^{18}$ ions/cm$^2$.

* * * * *